United States Patent
Shin-Ya

(10) Patent No.: US 9,648,997 B2
(45) Date of Patent: May 16, 2017

(54) WATERLESS TOILET AND TEMPORARY TOILET

(71) Applicant: Earthway Co., Ltd., Tottori (JP)

(72) Inventor: Kouichi Shin-Ya, Osaka (JP)

(73) Assignee: EARTHWAY CO., LTD., Tottori (JP)

( * ) Notice: Subject to any disclaimer, the term of this patent is extended or adjusted under 35 U.S.C. 154(b) by 124 days.

(21) Appl. No.: 14/405,527

(22) PCT Filed: Jun. 10, 2013

(86) PCT No.: PCT/JP2013/065934
§ 371 (c)(1),
(2) Date: Dec. 4, 2014

(87) PCT Pub. No.: WO2013/187351
PCT Pub. Date: Dec. 19, 2013

(65) Prior Publication Data
US 2015/0164292 A1    Jun. 18, 2015

(30) Foreign Application Priority Data

Jun. 11, 2012 (JP) .................................. 2012-132223

(51) Int. Cl.
*A47K 11/02* (2006.01)
*A47K 17/00* (2006.01)
*H01L 31/042* (2014.01)

(52) U.S. Cl.
CPC ............ *A47K 11/026* (2013.01); *A47K 11/02* (2013.01); *A47K 17/00* (2013.01); *H01L 31/042* (2013.01); *Y02E 10/50* (2013.01)

(58) Field of Classification Search
CPC . A47K 11/02; A47K 17/00; F24J 2/00; H01L 31/042

(Continued)

(56) References Cited

U.S. PATENT DOCUMENTS

| | | | | |
|---|---|---|---|---|
| 464,197 A | * | 12/1891 | Lanphear | A47K 11/02 193/18 |
| 5,345,620 A | * | 9/1994 | Sundberg | A47K 11/02 366/187 |

(Continued)

FOREIGN PATENT DOCUMENTS

| | | |
|---|---|---|
| JP | 04-212318 | 8/1992 |
| JP | 05-301088 | 11/1993 |

(Continued)

OTHER PUBLICATIONS

International Search Report issued Aug. 27, 2013 in International (PCT) Application No. PCT/JP2013/065934 with English translation.

*Primary Examiner* — Christine Skubinna
(74) *Attorney, Agent, or Firm* — Wenderoth, Lind & Ponack, L.L.P.

(57) ABSTRACT

A waterless toilet includes a urine/feces separation device, a transport conveyor, and a drier drum inside a casing. The urine/feces separation device includes rotary plates and fixed plates. The rotary plates are substantially triangular. Each fixed plate is provided between a pair of adjacent rotary plates. The transport conveyor has an endless belt wound around a driver roller and a driven roller. The drier drum includes drum main bodies and a drum heater. The drum main bodies are constructed like a metal net and supported in such a manner as to be freely rotatable. A first receptacle is provided below the urine/feces separation device to collect urine. The collected urine is heated and vaporized by a heater. Dried, solid waste is collected in a second receptacle below the drier drum and further dried by the heater.

9 Claims, 4 Drawing Sheets

(58) Field of Classification Search
USPC .................................... 4/111.6, 111.1–111.5
See application file for complete search history.

(56) References Cited

U.S. PATENT DOCUMENTS

| | | | | |
|---|---|---|---|---|
| 6,081,940 | A * | 7/2000 | Nien | ............... A47K 11/02 4/111.1 |
| 9,321,228 | B2 * | 4/2016 | Desoto-Burt | ........... B29C 49/18 |
| 2007/0199140 | A1 | 8/2007 | Lee | |

FOREIGN PATENT DOCUMENTS

| | | |
|---|---|---|
| JP | 11-14030 | 1/1999 |
| JP | 11-290242 | 10/1999 |
| JP | 2001-017347 | 1/2001 |
| JP | 2008-504861 | 2/2008 |
| KR | 10-2009-0054150 | 5/2005 |
| KR | 10-0966309 | 6/2010 |
| WO | 2006/004333 | 1/2006 |

\* cited by examiner

WATERLESS TOILET AND TEMPORARY TOILET

CROSS-REFERENCE TO RELATED APPLICATION

The present application hereby claims priority from Japanese Patent Application No. 2012-132223 filed Jun. 11, 2012, the entire contents of which are hereby incorporated herein by reference.

TECHNICAL FIELD

The present invention relates to waterless toilets and temporary toilets.

BACKGROUND ART

People generally urinate and defecate, for example, into a flush toilet. Care recipients, elderly people, patients, and similar people who have difficulty walking may in some situations not be able to do so and need to use portable toilets beside their beds to excrete (see, for example, JP 11-290242 A).

JP 11-14030 A suggests installing portable, temporary toilets at, for example, construction sites and event venues for dry disposal of urine and feces.

Problems to be Solved by the Invention

The portable toilet of JP 11-290242 A, every time a person is done using the toilet, requires a caregiver to remove a bucket to dispose of excreta and then wash the bucket before resetting it, which is troublesome to both the caregiver and the care recipient.

The temporary toilet of JP 11-14030 A stores urine and feces in a tank and funnels the urine and feces from the tank to an excreta disposal device for treatment. The toilet therefore requires an excreta disposal device that is separate from a toilet bowl, which makes the toilet bulky, complex, and costly.

SUMMARY OF THE INVENTION

The present invention, conceived in view of the above-noted problems, has an object to provide a waterless toilet that is capable of readily separating urine and feces for dry disposal without the need for a water supply, a sewer system, or a large footprint. It is also an object of the present invention to provide a temporary toilet, equipped with a waterless toilet, that can be transported and installed at any place.

Solution to Problem

A waterless toilet in accordance with the present invention includes: a box-like casing with a toilet seat being fixed on top and a heater being attached on bottom; a urine/feces separation device provided inside the casing; a transport conveyor, provided inside the casing, that has an endless belt wound around a driver roller and a driven roller; a drier drum including drum main bodies, an internal drum heater, and a drain pipe, the drum main bodies being constructed like metal nets, separated by a distance associated with a width of the transport conveyor, and supported in such a manner as to be freely rotatable, the drain pipe covering an outer circumference of substantially a lower half portion between the drum main bodies; a first receptacle, provided below the urine/feces separation device in such a manner as to be freely insertable/retractable, that collects urine; and a second receptacle, provided below the drier drum in such a manner as to be freely insertable/retractable, that collects dried, solid waste, wherein the urine/feces separation device includes rotary plates and fixed plates, the rotary plates being polygonal and fixed on rotation shafts at intervals along the rotation shafts, the rotation shafts being separated by a distance in a front/rear direction and supported in such a manner as to be freely rotatable, the fixed plates being provided between pairs of rotary plates that are adjacent in the front/rear direction, wherein urine and feces are separated in the urine/feces separation device, the urine is collected in the first receptacle where the urine is vaporized by the heater, and solid waste, including the separated feces and toilet paper, is transported to the drier drum via the urine/feces separation device and the transport conveyor, heated by the drum heater, collected in the second receptacle through meshes by intermittently rotating the drier drum, and dried by the heater.

According to this aspect of the present invention, when one sits on the toilet seat and urinates and defecates, urine is separated from feces in the urine/feces separation device, collected in the first receptacle, and heated by the heater to vaporize. Meanwhile, the feces, as well as toilet paper and other solid waste, are moved on the fixed plates by the rotating rotary plates, and as they reach the transport conveyor, transported to the drier drum by the transport conveyor. The feces and other solid waste, as they are heated by the drum heater in the drier drum and reduced in volume, are collected in the second receptacle through meshes by intermittently rotating the drier drum before being further heated by the heater.

As a result, the feces and other solid waste are reduced in volume as their water content is vaporized, and the urine is vaporized. The waterless toilet therefore eliminates troublesome jobs, such as disposal of excreta and washing, that would otherwise need to be done every time one urinates or defecates. The waterless toilet also obviates the need for a water supply and a sewer system and can be constructed in a size practically as small as a toilet seat. Therefore, the waterless toilet does not require a large footprint and may be installed at any place.

In the present invention, the casing preferably includes therein a frontal conveyor that covers up and closes a front of the urine/feces separation device and lateral conveyors that cover up and close left/right sides of the urine/feces separation device and the transport conveyor.

In this arrangement, the frontal conveyor and the left/right lateral conveyors cover up and close, like curtains, the periphery of the urine/feces separation device and the transport conveyor, thereby preventing urine from splashing out around the casing.

In the present invention, the casing preferably includes a frame that acts as a squeegee by coming into contact with a part of a belt for the frontal conveyor and parts of belts for the left/right lateral conveyors, all the parts facing the urine/feces separation device.

In this arrangement, the frame, acting as a squeegee, is able to rake the urine and feces sticking to the belts off down toward the urine/feces separation device during the orbital motion of the belts of the frontal conveyor and of the left/right lateral conveyors. Urine and feces are then separated in the urine/feces separation device and collected separately.

In the present invention, the casing preferably includes a ventilation fan that vents air out of the casing.

In this arrangement, the ventilation fan vents out vapor containing an unpleasant odor of excreta and an unpleasant odor produced by heating by the heater, for example, to the outdoors.

In the present invention, the casing preferably includes an ultraviolet light projection lamp.

In this arrangement, the ultraviolet light projection lamp projects ultraviolet light onto, for example, a belt, of the transport conveyor, that transports feces and other solid waste in its orbital motion, thereby killing *Escherichia coli* and other bacteria on the belt. The intensity of ultraviolet light that is needed for 99.9% disinfection varies from one bacterium to the other and is set, as an example, to 5,400 µw·sec/cm$^2$) in the case of *Escherichia coli*.

A temporary toilet in accordance with the present invention includes: a simple enclosure including a fan heater, a urine tank, and a rechargeable battery, all provided in an underfloor space of the simple enclosure; a solar cell module mounted on a roof of the simple enclosure; and a waterless toilet, provided inside the simple enclosure, that includes a urine/feces separation device, a transport conveyor, and a drier drum inside a box-like casing that has a toilet seat being fixed on top and that further includes below the drier drum a receptacle, provided in such a manner as to be freely insertable/retractable, that collects dried, solid waste, the urine/feces separation device including rotary plates and fixed plates, the rotary plates being polygonal and fixed on rotation shafts at intervals, the rotation shafts being separated by a distance in a front/rear direction and supported in such a manner as to be freely rotatable, the fixed plates being provided between pairs of rotary plates that are adjacent in the front/rear direction, the transport conveyor having an endless belt wound around a driver roller and a driven roller, the drier drum including drum main bodies and a drain pipe, the drum main bodies being constructed like metal nets, separated by a distance associated with a width of the transport conveyor, and supported in such a manner as to be freely rotatable, the drain pipe covering an outer circumference of substantially a lower half portion between the drum main bodies, wherein the solar cell module generates electric power which is stored in the rechargeable battery for use as a power supply for the urine/feces separation device, the transport conveyor, and the drier drum, urine and feces are separated in the urine/feces separation device, the urine is collected in the urine tank, and the solid waste, including the separated feces and toilet paper, is transported to the drier drum via the urine/feces separation device and the transport conveyor, heated by heated air supplied by the fan heater, and collected in the receptacle through meshes by intermittently rotating the drier drum.

According to this aspect of the present invention, when one urinates and defecates using the waterless toilet in the simple enclosure, urine is separated from feces in the urine/feces separation device and collected in the urine tank. Meanwhile, the feces, as well as toilet paper and other solid waste, are moved on the fixed plates by the rotating rotary plates, and as they reach the transport conveyor, transported to the drier drum by the transport conveyor. The feces and other solid waste, as they are heated by heated air supplied by the fan heater and reduced in volume, are collected in the receptacle through meshes by intermittently rotating the drier drum before being further heated by the heated air.

The urine/feces separation device in the waterless toilet, as an example, is preferably powered by the electric power generated by the solar cell module mounted on the roof and stored in the rechargeable battery. In addition, the fan heater, the rechargeable battery, and the urine tank are preferably provided in the underfloor space.

In this arrangement, the temporary toilet as a whole can be constructed in a small size. In addition, when no commercial power supply is available, the temporary toilet is capable of collecting urine in the urine tank and reducing feces and other solid waste in volume by vaporizing their water content before collecting them. The temporary toilet is therefore capable of heavy use and may be transported and installed at any place.

Advantageous Effects of the Invention

A waterless toilet in accordance with the present invention obviates the need for a water supply and a sewer system and is capable of readily separating urine and feces for dry disposal, without requiring a large footprint.

A temporary toilet in accordance with the present invention readily separates urine and feces before drying and collecting them even when there is no commercial power supply available. The temporary toilet is therefore capable of heavy use and as a whole can be constructed in a small size. The temporary toilet may be transported and installed at any place.

DESCRIPTION OF THE EMBODIMENTS

The following will describe embodiments in accordance with the present invention in reference to the drawings.

Figure 1:
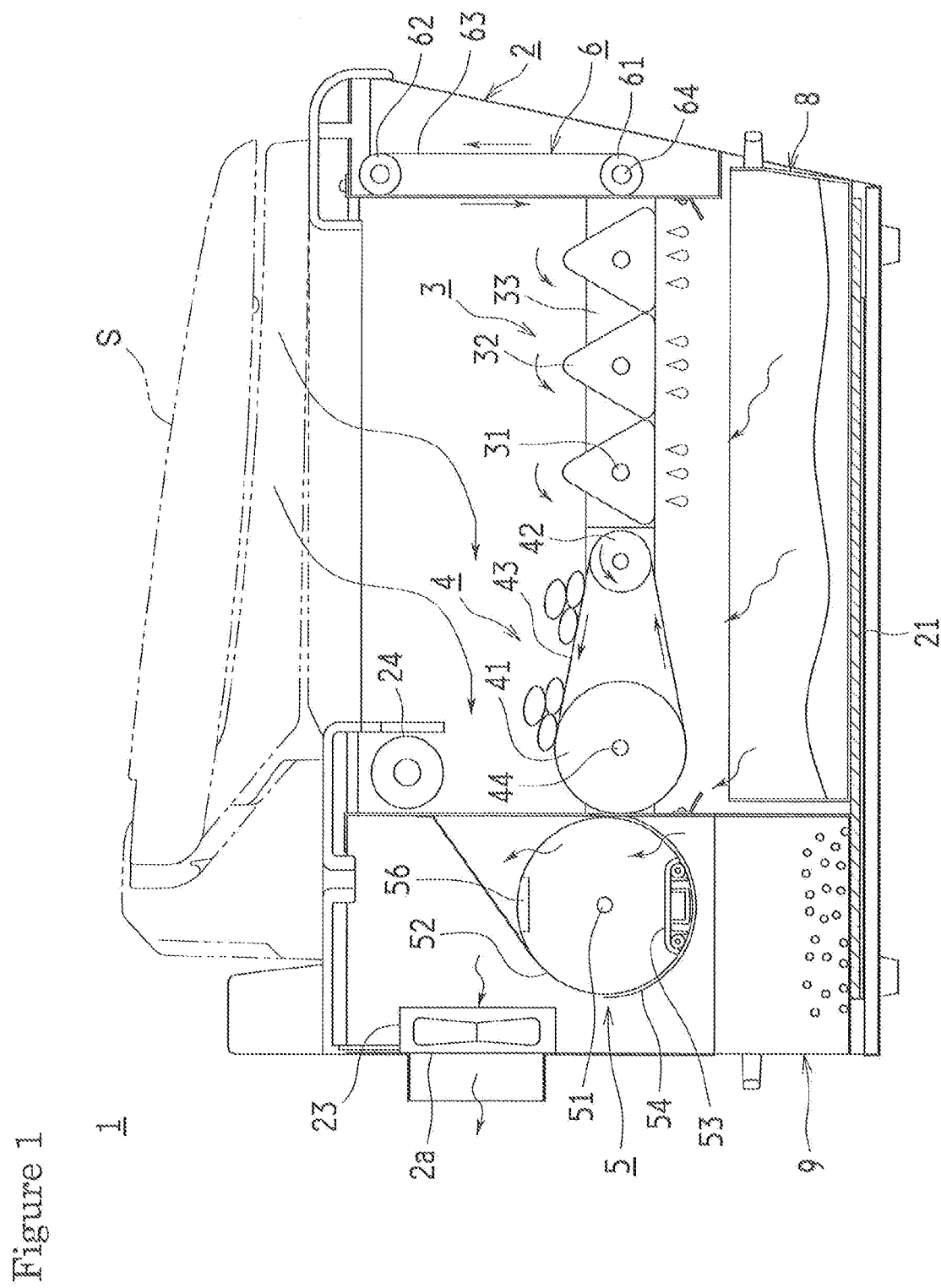
FIG. 1 is a cross-sectional view of an embodiment of a waterless toilet in accordance with the present invention.
Figure 2:
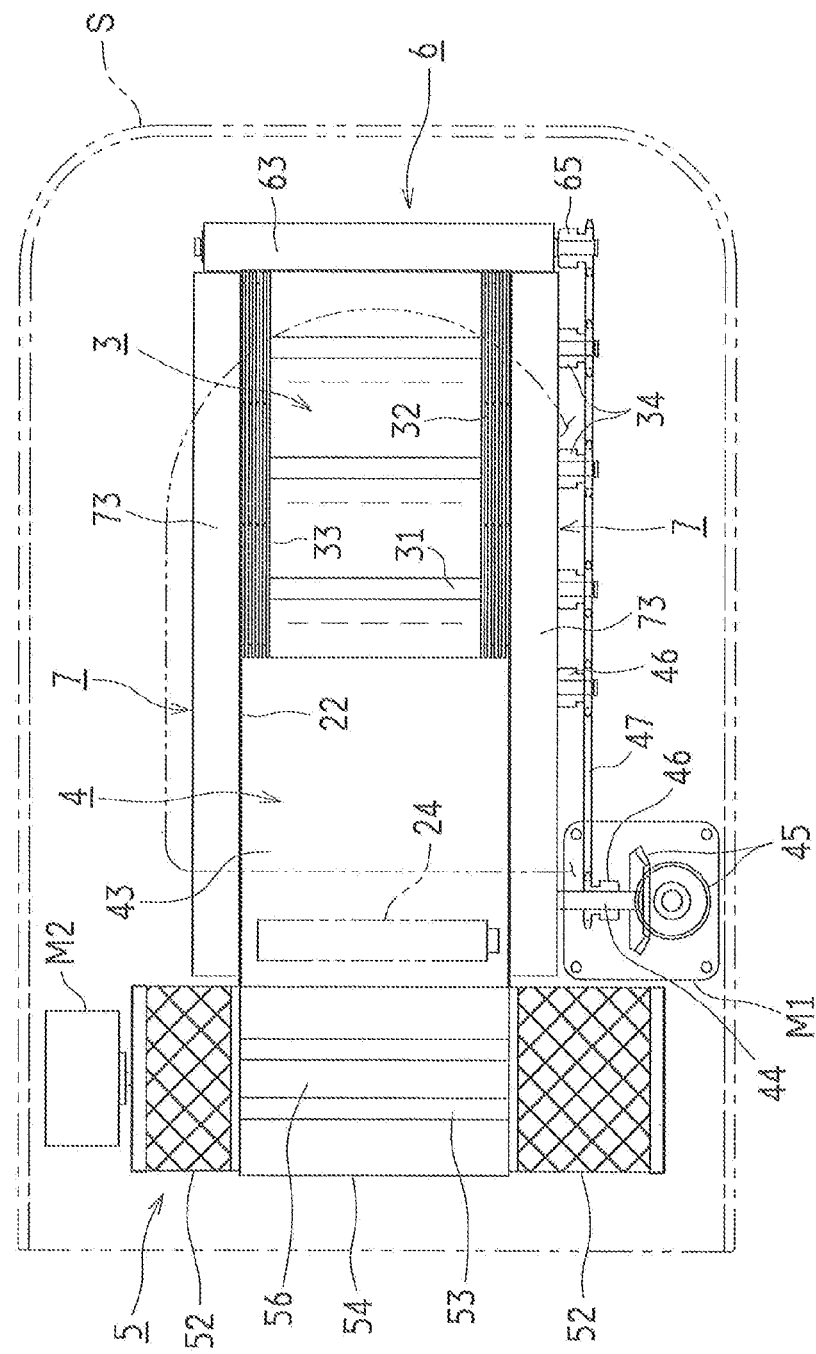
FIG. 2 is a plan view of the internal structure of the waterless toilet shown in FIG. 1.
Figure 3:
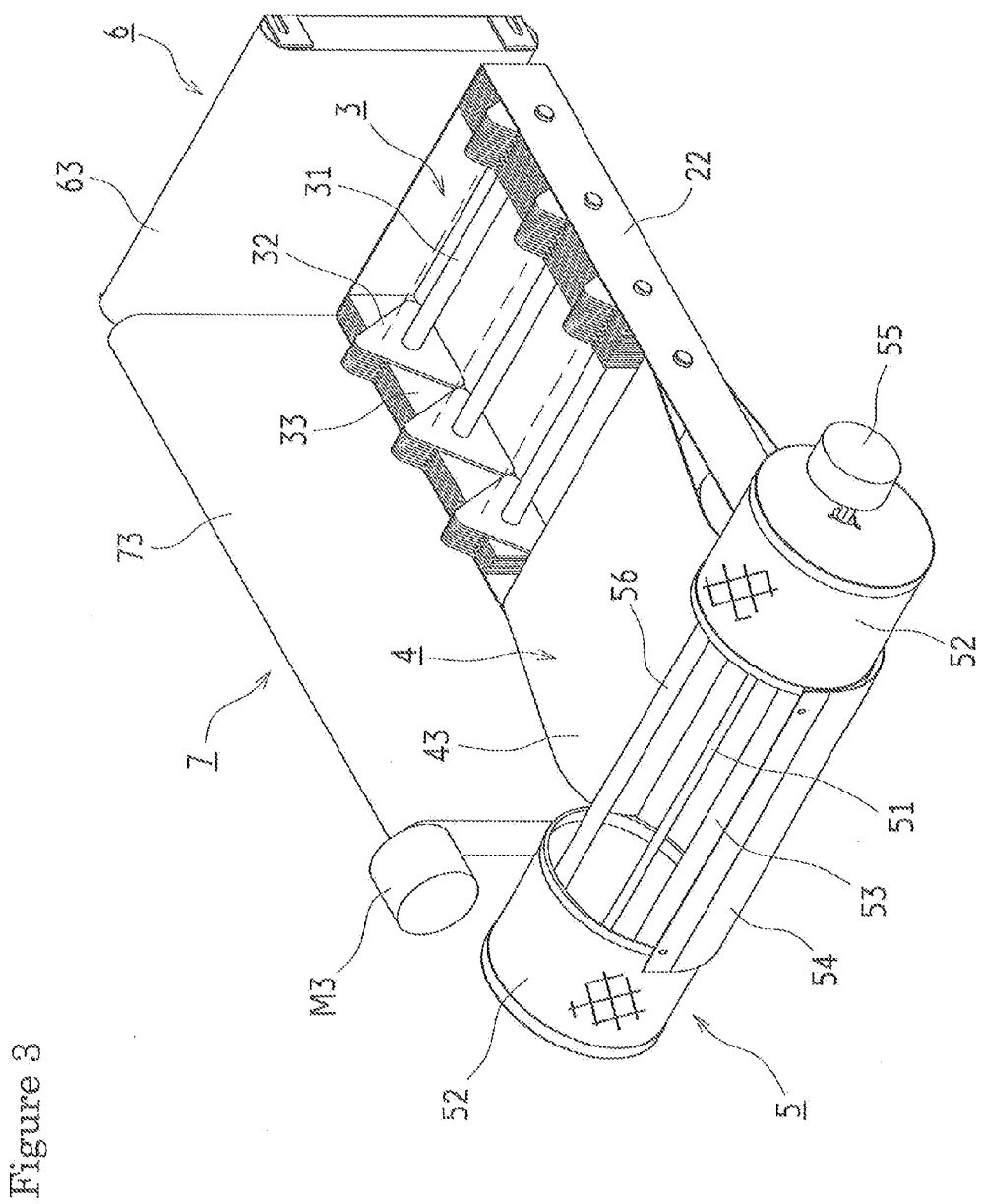
FIG. 3 is a partial perspective view of major parts of a waterless toilet in accordance with the present invention.

FIGS. 1 to 3 show an embodiment of a waterless toilet 1 in accordance with the present invention.

The waterless toilet 1 includes a casing 2, a urine/feces separation device 3, a transport conveyor 4, a drier drum 5, a frontal conveyor 6, lateral conveyors 7, a first receptacle 8, and a second receptacle 9. The casing 2 is shaped like a box and includes a heater 21 on its bottom. On top of the casing 2, there is attached a commercially available toilet seat S, such as a bidet toilet seat. The urine/feces separation device 3 is provided inside the casing 2. The transport conveyor 4 is provided behind and contiguously to the urine/feces separation device 3. The drier drum 5 is provided behind and contiguously to the transport conveyor 4. The frontal conveyor 6 and the lateral conveyors 7 cover up and close the front and left/right sides, respectively, of the urine/feces separation device 3 and the transport conveyor 4, like curtains. The first receptacle 8 is provided below the urine/feces separation device 3 with its opening facing upward in such a manner as to be freely insertable/retractable. The second receptacle 9 is provided below the drier drum 5 with its opening facing upward in such a manner as to be freely insertable/retractable.

The urine/feces separation device 3 is supported by a quadrate frame 22 in such a manner as to be freely rotatable around a plurality of rotation shafts 31 (three, in this example) separated by a distance in the front/rear direction.

The quadrate frame 22 is fixed to the casing 2. On each rotation shaft 31, substantially triangular rotary plates 32 are fixed at intervals along the rotation shaft. A fixed plate 33 is provided between each pair of adjacent rotary plates 32. Each fixed plate 33 has such dimensions that it can fit into a space between two rotary plates 32, one located in front of it and the other located behind it. Each rotation shaft 31 has a sprocket 34 being fixed at an end thereof. A chain 47 is wound around the sprockets 34. As will be described later in detail, orbital motion of the chain 47 causes rotation of the rotation shafts 31, thereby simultaneously rotating all the rotary plates 32 in the same direction.

The transport conveyor 4 is provided behind the urine/feces separation device 3. The transport conveyor 4 includes a driver roller 41 and a driven roller 42 that are separated by a distance in the front/rear direction and supported in such a manner as to be freely rotatable. An endless belt 43 is wound around the driver roller 41 and the driven roller 42. A rotation shaft 44, fixed to the driver roller 41, is coupled to an electric motor M1 via bevel gears 45. The electric motor M1 is fixed to the casing 2. Rotation of the electric motor M1 causes rotation of the rotation shaft 44, and thereby rotation of the driver roller 41, via the bevel gears 45, causing the belt 43 to orbit around the driver roller 41 and the driven roller 42.

Sprockets 46 are fixed to the rotation shafts 44 of the transport conveyor 4. The chain 47 is wound around these sprockets 46, the sprockets 34 fixed to the rotation shafts 31 of the urine/feces separation device 3, and a sprocket 65 (which will be described later in detail) fixed to a rotation shaft 64 of the frontal conveyor 6.

The drier drum 5 includes a freely rotatable rotation shaft 51 extending in the left/right direction in the casing 2. Drum main bodies 52, both fixed to the rotation shaft 51, are separated by a distance associated with the width of the belt 43 of the transport conveyor 4. The left/right drum main bodies 52 are made by curving a metal net, such as a lath, in a cylindrical shape. A drum heater 53 is provided inside and links the left/right drum main bodies 52. A substantially semicylindrical drain pipe 54 is provided to practically cover a lower half portion of the outer circumferential face of the virtually cylindrical space between the left/right drum main bodies 52. The drain pipe 54 has a width that is slightly larger than the width of the belt 43 of the transport conveyor 4 and has an inner diameter that is slightly larger than the outer diameter of the drum main bodies 52. The drain pipe 54 is coupled at its frontal end to the frame 22.

An electric motor M2 is coupled to an end of the rotation shaft 51 of the drier drum 5. The electric motor M2 rotates the rotation shaft 51, thereby rotating the left/right drum main bodies 52 together with the drum heater 53.

A rotational joint 55 is provided at another end of the rotation shaft 51 of the drier drum 5 to enable continuous electric power supply to the drum heater 53 that is rotated in conjunction with the rotating drier drum 5.

The left/right drum main bodies 52 are coupled integrally by a coupling member 56 that is located 180° opposite the drum heater 53.

The frontal conveyor 6 is located in front of the urine/feces separation device 3. The frontal conveyor 6 includes a driver roller 61 and a driven roller 62 that are separated by a distance in the up/down direction in the casing 2 and supported in such a manner as to be freely rotatable. An endless belt 63 is wound around the driver roller 61 and the driven roller 62. The rotation shaft 64, fixed to the driver roller 61, has the sprocket 65 fixed at an end thereof. The chain 47 is wound around the sprocket 65, as well as around the sprockets 46 fixed to the rotation shafts 44 of the transport conveyor 4 and the sprockets 34 fixed to the rotation shafts 31 of the urine/feces separation device 3.

The lateral conveyors 7 are provided respectively on the left/right sides of the urine/feces separation device 3 and the transport conveyor 4. Each lateral conveyor 7 includes a driver roller, a driven roller, and an endless belt 73. The driver rollers and driven rollers are separated by a distance in the up/down direction in the casing 2 and supported in such a manner as to be freely rotatable. The endless belt 73 is wound around these driver rollers and driven rollers. An electric motor M3 is coupled to a rotation shaft fixed to the driver roller.

The belt 43 of the transport conveyor 4, the belt 63 of the frontal conveyor 6, and the belts 73 of the lateral conveyors 7 are each set up to come into contact with an upper edge of an associated side of the frame 22.

A gas discharge port 2a is provided in the rear of the casing 2. In the rear of the casing 2, there is also provided a ventilation fan 23 facing the gas discharge port 2a. The ventilation fan 23, when powered, vents air out of the casing 2 (e.g., to the outdoors) through a gas discharge hose (not shown) connected to the gas discharge port 2a.

An ultraviolet light projection lamp 24 is provided above the transport conveyor 4 in the casing 2. The provision of the lamp 24 enables disinfection of the belt 43 and the drier drum 5.

Next, the operation of the waterless toilet 1 constructed as above will be described.

The ventilation fan 23 is continuously powered to vent air out of the casing 2 (e.g., to the outdoors) to dry solid waste and prevent an unpleasant odor from spreading to the surroundings. The ultraviolet light projection lamp 24 is set up to be turned off while the waterless toilet 1 is being used and to be turned on while the waterless toilet 1 is not being used. The ultraviolet light projection lamp 24, when turned on, projects ultraviolet light that disinfects the belt 43 of the transport conveyor 4 and the drier drum 5.

When one is to use the waterless toilet 1, he/she manually operates an electric switch (not shown) to turn on the electric motors M1, M2, and M3, the drum heater 54, and the heater 21.

The electric motor M1, when turned on, rotates the rotation shaft 44 of the transport conveyor 4 via the bevel gears 45, causing orbital motion of the belt 43 wound around the driver roller 41 and the driven roller 42. The belt 43 transports the solid waste sitting thereon in the direction of the rear of the casing 2.

Rotation of the rotation shaft 44 of the transport conveyor 4 causes rotation of the sprocket 46 fixed to the rotation shaft 44, which in turn causes orbital motion of the chain 47 wound around the sprocket 46. Under these circumstances, the chain 47 is wound sequentially around the sprockets 34 fixed to the rotation shafts 31 of the urine/feces separation device 3 and the sprocket 65 fixed to the rotation shaft 64 of the frontal conveyor 6. The chain 47 therefore rotates the sprockets 34 and 65, hence the rotation shafts 31 and 64, counterclockwise in FIG. 1. That rotates the rotary plates 32 fixed to the rotation shafts 31 of the urine/feces separation device 3 also in the counterclockwise direction and rotates the driver roller 61 via the rotation shaft 64 of the frontal conveyor 6. The rotation of the driver roller 61 in turn causes orbital motion in the same direction of the belt 63 wound around the driver roller 61 and the driven roller 62.

The electric motors M3, when turned on, rotate driver rollers via the rotation shafts of the left/right lateral conveyors 7. That causes such orbital motion of the belts 73 wound around the driver rollers and the driven rollers that those parts of the belts 73 that face the urine/feces separation device 3 move downward.

If one sits on the toilet seat S and urinates and defecates, urine and feces fall on the urine/feces separation device 3. Under these circumstances, the urine is collected in the first receptacle 8 as it drops through gaps between pairs of front/rear rotary plates 32 and gaps between the rotary plates 32 and the fixed plates 33. Meanwhile, the feces, as well as toilet paper and other solid waste, are pushed by the rotation of the rotary plates 32 while being supported over the fixed plates 33, thereby being moved on the fixed plates 33 in the direction of the rear of the casing 2. The feces is ultimately transported from the urine/feces separation device 3 onto the belt 43 of the transport conveyor 4. The feces, toilet paper, and other solid waste transported onto the belt 43 of the transport conveyor 4 are moved by the belt 43 that is in orbital motion until they fall on the drum heater 53 and/or the drain pipe 54 between the left/right drum main bodies 52 in the drier drum 5, where they are heated by the drum heater 53 that is heated at about 100° C. to 130° C. and reduced in volume by vaporizing the water content.

In this situation, the drier drum 5 is controlled to repeat rotation and suspension of the rotation at predetermined time intervals. Specifically, the drier drum 5 is rotated by the electric motor M2 for a predetermined period of time with the drum heater 53 continuously heating the feces, toilet paper, and other solid waste. Thereafter, the rotation is suspended for a predetermined period of time, and the drier drum 5 is then rotated again for a predetermined period of time. This cycle is repeated.

The solid waste on the drum heater 53, as it is dried and reduced in volume while the drier drum 5 is rotating, drops out of the rotating drum heater 53 and falls on the drain pipe 54. The fallen solid waste is raked up again by the drum heater 53 that is rotating from the top position to the bottom position and then back to the top position. The solid waste is hence rolled on the drum heater 53, moving toward the left/right drum main bodies 52. When the solid waste is reduced in volume to such dimensions that it can pass through meshes of the drum main bodies 52, it drops out of the drier drum 5 and is collected in the second receptacle 9 that is located below the drier drum 5 and has an opening facing the bottom of the drier drum 5. Some of the solid waste that is not yet dry and is still sticking to the drum heater 53 is continuously heated by the drum heater 53 so that its water content can vaporize.

If the predetermined period of time has elapsed, and a predetermined number of rotations has been reached, the drier drum 5 is controlled to stop rotating when the drum heater 53 moves into the bottom position.

The urine collected in the first receptacle 8 and the solid waste, such as toilet paper and feces, collected in the second receptacle 9 are heated by the heater 21 located on the bottom of the casing 2. The heater 21 is heated at about 100° C. to 130° C.

The urine collected in the first receptacle 8 is heated and vaporized by the heater 21. The solid waste collected in the second receptacle 9 is heated by the heater 21 so that its water content is vaporized. Therefore, even if insufficiently dried solid waste falls onto the second receptacle 9 from the drier drum 5, that solid waste is heated further by the heater 21 so that its water content is vaporized and the solid waste is disinfected by the heat.

Even if the heater 21 fails to timely vaporize the urine collected in the first receptacle 8 due to heavy use, leaving some of the urine unvaporized, it can be disposed of into a toilet. In addition, since urine can be completely separated from solid waste, such as feces and toilet paper, urine may be used as a liquid fertilizer. Solid waste may also be used as a fertilizer because it is disinfected with heat.

The vapor (unpleasant odor) that is produced when the first receptacle 8 or the second receptacle 9 is heated by the heater 21 is continuously vented out by the ventilation fan 23 (e.g., to the outdoors).

When one sits on the toilet seat S and urinates, most of the urine is discharged forward. The urine hits the belt 63 of the frontal conveyor 6, being prevented from splashing out of the casing 2, because of the provision of the curtain-like frontal conveyor 6 in front of the urine/feces separation device 3 and of the orbital motion of the belt 63. Similarly, the lateral conveyors 7 provided like a curtain on the left/right sides of the urine/feces separation device 3 and the transport conveyor 4, as well as the belts 73 in orbital motion, prevent urine flying sideways from splashing out of the casing 2.

In this situation, the surfaces of the belt 63 of the frontal conveyor 6 and of the belts 73 of the lateral conveyors 7 move into contact with upper edges of the frame 22 that rake the urine sticking to the surfaces of the belts 63 and 73 off down into the first receptacle 8. The frame 22 thus acts as a squeegee. Similarly, the surface of the belt 43 of the transport conveyor 4 moves into contact with an upper edge of the frame 22 that rakes the toilet paper and feces sticking to the surface of the belt 43 off down into the drier drum 5.

The waterless toilet 1 in accordance with the present invention, as discussed above, is as compact as a typical toilet with a fixed toilet seat S and can be installed at any place without requiring extra space. Besides, excreta is separated into solid waste, such as feces and toilet paper, and urine for separate heat treatment. Therefore, the water content of the solid waste can be vaporized to reduce the solid waste in volume before disposal, and the urine can be vaporized or reduced in volume before disposal. That reduces complexity of disposal.

The waterless toilet 1 may be installed not only at homes, but also in a simple enclosure at event venues and construction sites and on public transport vehicles, such as buses and trains, vessels, and airplanes.

The embodiment above is an example where the rotary plates 32 of the urine/feces separation device 3 are substantially triangular. The rotary plates 32 may alternatively be polygonal.

The electric motors may be powered by a commercially available electric power generator, as well as by a commercial power supply. Alternatively, electric power may be generated from a renewable energy resource, such as sunlight or wind, and stored in a rechargeable battery as a power supply for the electric motors.

Figure 4:
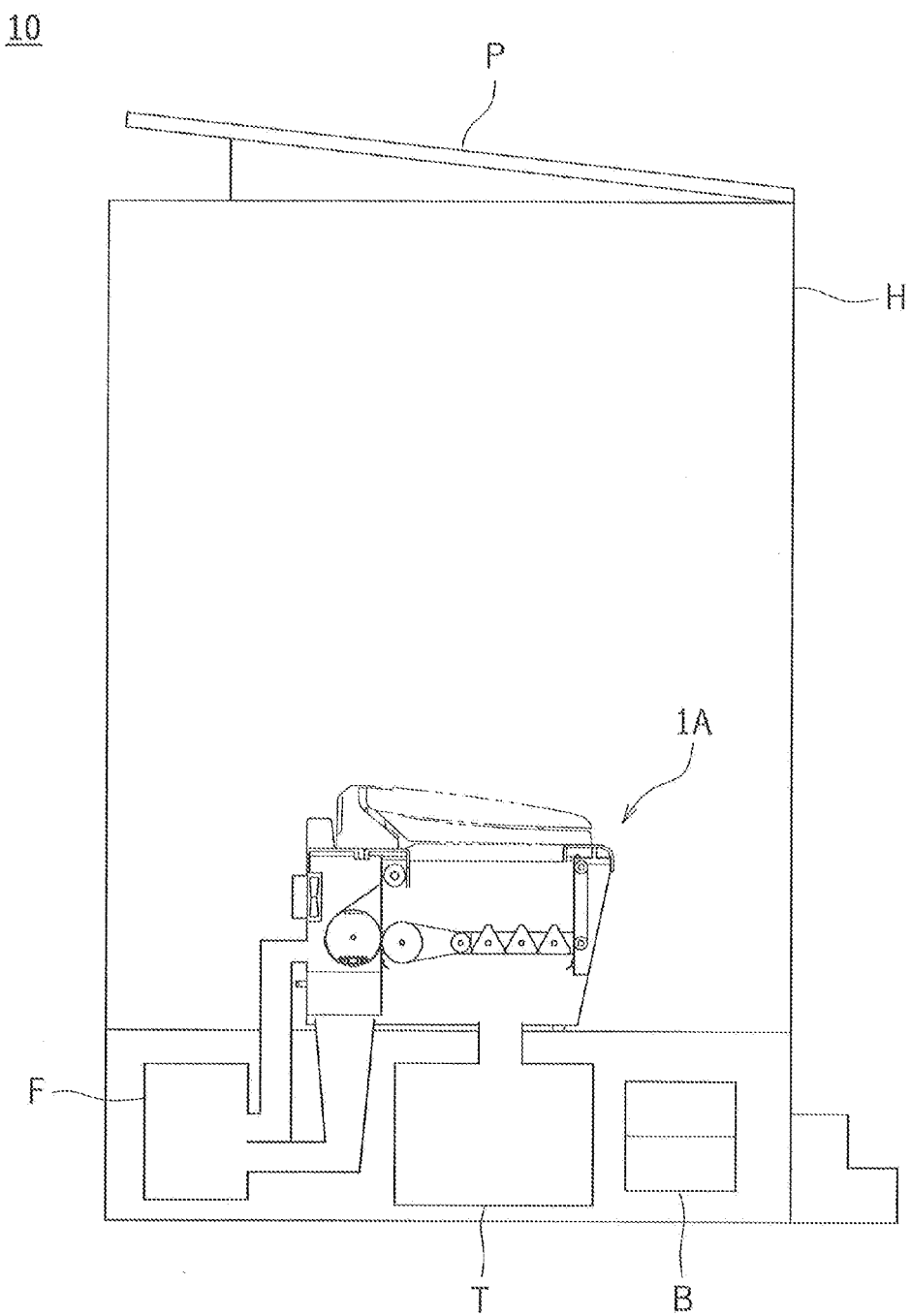
FIG. 4 is a schematic view of a temporary toilet in accordance with the present invention.

For example, when no commercial power supply is available, a temporary toilet 10 may be provided as illustrated in FIG. 4. Specifically, a waterless toilet 1A is placed in a simple enclosure H. A rechargeable battery B and a fan heater F, such as a kerosene fan heater, are provided in an underfloor space of the simple enclosure H. The waterless toilet 1A includes a urine tank T located right below the urine/feces separation device 3 and in communication with the urine/feces separation device 3. On the roof of the simple enclosure H, there is provided a solar cell module P. Electric power is generated by the solar cell module P and stored in the rechargeable battery B for power supply to, for example, the electric motor M1 for the urine/feces separation device 3 and the transport conveyor 4, the electric motor M2 for the drier drum 5, the fan 23, and the ultraviolet light projection lamp 24. In addition, heated air of approximately 110° C. to 130° C. is supplied to the drier drum 5 and the receptacle 9 from the fan heater F to dry the feces in the drier drum 5 and the receptacle 9.

The urine collected in the urine tank T may be sprayed, for example, over trees as a liquid fertilizer.

As described above, the temporary toilet 10 can be constructed in a small size and is capable of heavy use. Therefore, the temporary toilet 10 and the waterless toilet 1A may be transported and installed at any place.

The waterless toilet 1A is a modification of the waterless toilet 1 described above, including no heater 21 or first receptacle 8 so that it can be used as a part of the temporary toilet 10. The waterless toilet 1A is otherwise constructed in the same manner as the waterless toilet 1. Further description of its details is omitted.

The drum heater 53 is, however, controlled not to be powered.

The present invention may be implemented in various forms without departing from its spirit and main features. Therefore, the aforementioned examples are for illustrative purposes only in every respect and should not be subjected to any restrictive interpretations. The scope of the present invention is defined only by the claims and never bound by the specification. Those modifications and variations that may lead to equivalents of claimed elements are all included within the scope of the invention.

REFERENCE SIGNS LIST 1, 1A Waterless Toilet
2 Casing
21 Heater
22 Frame
3 Urine/Feces Separation Device
32 Rotary Plate
33 Fixed Plate
4 Transport Conveyor
43 Belt
5 Drier Drum
52 Drum Main Body
53 Drum Heater
54 Drain Pipe
6 Frontal Conveyor
63 Belt
7 Lateral Conveyor
73 Belt
8 First Receptacle
9 Second Receptacle
10 Temporary Toilet
S Toilet Seat
H Simple Enclosure
B Rechargeable Battery
F Fan Heater
P Solar Cell Module
T Urine Tank

The invention claimed is:

1. A waterless toilet, comprising:
a box-like casing with a toilet seat being fixed on top and a heater being attached on bottom;
a urine/feces separation device provided inside the casing;
a transport conveyor, provided inside the casing, that has an endless belt wound around a driver roller and a driven roller;
a drier drum including drum main bodies, an internal drum heater, and a drain pipe,
the drum main bodies being constructed like metal nets with meshes, separated by a distance associated with a width of the transport conveyor, and supported in such a manner as to be freely rotatable,
the drain pipe covering an outer circumference of substantially a lower half portion between the drum main bodies;
a first receptacle, provided below the urine/feces separation device in such a manner as to be freely insertable/retractable, that collects urine; and
a second receptacle, provided below the drier drum in such a manner as to be freely insertable/retractable, that collects solid waste,
wherein
the urine/feces separation device includes rotary plates and fixed plates,
the rotary plates being polygonal and fixed on rotation shafts at intervals along the rotation shafts, the rotation shafts being separated by a distance in a front/rear direction and supported in such a manner as to be freely rotatable,
the fixed plates being provided between pairs of rotary plates that are adjacent in the front/rear direction,
wherein
urine and feces are separated in the urine/feces separation device,
the urine is collected in the first receptacle where the urine is vaporized by the heater, and
solid waste, including the separated feces and toilet paper, is transported to the drier drum via the urine/feces separation device and the transport conveyor, heated by the internal drum heater, collected in the second receptacle through the meshes of the drum main bodies by intermittently rotating the drier drum, and dried by the heater.

2. The waterless toilet as set forth in claim 1, wherein the casing includes therein a frontal conveyor that covers up and closes a front of the urine/feces separation device and lateral conveyors that cover up and close left/right sides of the urine/feces separation device and the transport conveyor.

3. The waterless toilet as set forth in claim 2, wherein the casing includes a frame that acts as a squeegee by coming into contact with a belt for the frontal conveyor and belts for the left/right lateral conveyors, on a side where each of the belts faces the urine/feces separation device.

4. The waterless toilet as set forth in claim 1, wherein the casing includes a ventilation fan that vents air out of the casing.

5. The waterless toilet as set forth in claim 1, wherein the casing includes an ultraviolet light projection lamp.

6. The waterless toilet as set forth in claim 2, wherein the casing includes a ventilation fan that vents air out of the casing.

7. The waterless toilet as set forth in claim 3, wherein the casing includes a ventilation fan that vents air out of the casing.

8. The waterless toilet as set forth in claim 2, wherein the casing includes an ultraviolet light projection lamp.

9. The waterless toilet as set forth in claim 3, wherein the casing includes an ultraviolet light projection lamp.

* * * * *